United States Patent
Goorden et al.

(10) Patent No.: US 12,189,314 B2
(45) Date of Patent: Jan. 7, 2025

(54) METROLOGY METHOD AND ASSOCIATED METROLOGY AND LITHOGRAPHIC APPARATUSES

(71) Applicant: ASML NETHERLANDS B.V., Veldhoven (NL)

(72) Inventors: Sebastianus Adrianus Goorden, Eindhoven (NL); Simon Gijsbert Josephus Mathijssen, Rosmalen (NL); Leendert Jan Karssemeijer, Hertogenbosch (NL); Manouk Rijpstra, Eindhoven (NL); Ralph Brinkhof, Vught (NL); Kaustuve Bhattacharyya, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 52 days.

(21) Appl. No.: 18/035,008

(22) PCT Filed: Nov. 4, 2021

(86) PCT No.: PCT/EP2021/080602
§ 371 (c)(1),
(2) Date: May 2, 2023

(87) PCT Pub. No.: WO2022/111967
PCT Pub. Date: Jun. 2, 2022

(65) Prior Publication Data
US 2024/0012342 A1    Jan. 11, 2024

(30) Foreign Application Priority Data
Nov. 27, 2020    (EP) ...................... 20210371

(51) Int. Cl.
G03F 9/00    (2006.01)
G03F 7/00    (2006.01)

(52) U.S. Cl.
CPC ........ G03F 9/7046 (2013.01); G03F 7/70625 (2013.01); G03F 7/706831 (2023.05); G03F 7/706837 (2023.05)

(58) Field of Classification Search
CPC ............. G03F 7/70616; G03F 7/70625; G03F 7/70633; G03F 7/706831; G03F 7/706837;
(Continued)

(56) References Cited

U.S. PATENT DOCUMENTS 6,961,116 B2    11/2005    Den Boef et al.
7,880,880 B2    2/2011    Van Bilsen et al.
(Continued)

FOREIGN PATENT DOCUMENTS

EP    1628164    2/2006
EP    3477389    5/2019
(Continued)

OTHER PUBLICATIONS

International Search Report and Written Opinion issued in corresponding PCT Application No. PCT/EP2021/080602, dated Mar. 11, 2022.
(Continued)

*Primary Examiner* — Deoram Persaud
(74) *Attorney, Agent, or Firm* — Pillsbury Winthrop Shaw Pittman, LLP (57) ABSTRACT

A method for a metrology process, the method includes obtaining first measurement data relating to a first set of measurement conditions and determining a first measurement recipe based on the first measurement data. At least one performance indicator is determined from one or more components of the first measurement data obtained from a component analysis or statistical decomposition. Alternatively, at least one performance indicator is determined from
(Continued)

a comparison of one or more first measurement values relating to the first measurement recipe and one or more second measurement values relating to a second measurement recipe, where second measurement recipe is different to the first measurement data and relates a second set of measurement conditions, the second set of measurement conditions being different to the first set of measurement conditions.

20 Claims, 3 Drawing Sheets

(58) Field of Classification Search
CPC .......... G03F 9/7046; C02F 1/40; C02F 3/082; C02F 3/105; C02F 3/106; C02F 3/107; C02F 3/108; C02F 3/1215; C02F 3/1284; C02F 3/302; B01D 17/02; B01D 21/2461; B01D 35/02; B02C 2201/06; C07B 2200/05; C07F 5/027; C07F 7/0816; C07F 7/30; C09K 11/06; Y02W 10/10; H10K 50/12; H10K 50/19; H10K 85/342; H10K 85/346; H10K 85/40; H10K 85/658
See application file for complete search history.

(56) References Cited

U.S. PATENT DOCUMENTS

| | | | |
|---|---|---|---|
| 9,405,204 B2 | 8/2016 | Huang et al. | |
| 11,152,237 B2* | 10/2021 | Nakada | H01L 21/67069 |
| 11,586,114 B2* | 2/2023 | Hsu | G03F 7/70266 |
| 2006/0033921 A1 | 2/2006 | Den Boef et al. | |
| 2006/0066855 A1 | 3/2006 | Den Boef et al. | |
| 2009/0195768 A1 | 8/2009 | Bijnen et al. | |
| 2009/0248337 A1 | 10/2009 | Habets et al. | |
| 2010/0198556 A1* | 8/2010 | Kost | G05B 23/0221 702/183 |
| 2010/0201963 A1 | 8/2010 | Cramer et al. | |
| 2010/0328655 A1 | 12/2010 | Den Boef | |
| 2011/0026032 A1 | 2/2011 | Den Boef et al. | |
| 2011/0027704 A1 | 2/2011 | Cramer et al. | |
| 2011/0043791 A1 | 2/2011 | Smilde et al. | |
| 2011/0102753 A1 | 5/2011 | Van De Kerkhof et al. | |
| 2011/0249244 A1 | 10/2011 | Leewis et al. | |
| 2012/0044470 A1 | 2/2012 | Smilde et al. | |
| 2012/0123581 A1 | 5/2012 | Smilde et al. | |
| 2013/0141723 A1 | 6/2013 | Wei et al. | |
| 2013/0258310 A1 | 10/2013 | Smilde et al. | |
| 2013/0271740 A1 | 10/2013 | Quintanilha | |
| 2013/0304408 A1 | 11/2013 | Pandev | |
| 2015/0025668 A1 | 1/2015 | Ye et al. | |
| 2015/0261097 A1 | 9/2015 | Mathijssen | |
| 2015/0355554 A1 | 12/2015 | Mathijssen | |
| 2016/0042105 A1 | 2/2016 | Adel et al. | |
| 2016/0290796 A1 | 10/2016 | Levy et al. | |
| 2018/0088470 A1* | 3/2018 | Bhattacharyya | G03F 7/705 |
| 2019/0004437 A1 | 1/2019 | Bhattacharyya et al. | |
| 2019/0041329 A1 | 2/2019 | Hill et al. | |
| 2019/0049859 A1* | 2/2019 | Tsiatmas | G03F 7/7065 |
| 2019/0094721 A1 | 3/2019 | Tinnemans et al. | |
| 2019/0137892 A1* | 5/2019 | Cekli | H01L 22/12 |
| 2019/0204750 A1 | 7/2019 | Wang et al. | |
| 2019/0378012 A1 | 12/2019 | Tripodi et al. | |
| 2024/0118629 A1* | 4/2024 | Keyvani Janbahan | G03F 7/706839 |
| 2024/0118631 A1* | 4/2024 | Thissen | G03F 7/70616 |
| 2024/0184221 A1* | 6/2024 | Rehman | G03F 9/7046 |
| 2024/0210844 A1* | 6/2024 | Tinnemans | G03F 7/70616 |

FOREIGN PATENT DOCUMENTS

| | | |
|---|---|---|
| WO | 2009/078708 | 6/2009 |
| WO | 2009/106279 | 9/2009 |
| WO | 2013/178422 | 12/2013 |
| WO | 2015/051970 | 4/2015 |
| WO | 2018/114152 | 6/2018 |
| WO | 2019/020292 | 1/2019 |
| WO | 2020/057900 | 3/2020 |
| WO | 2021/001102 | 1/2021 |

OTHER PUBLICATIONS

Anonymous, "Metrology Method and Associated Metrology and Lithographic Apparatuses", Research Disclosure, vol. 676, No. 33, pp. 1-21 (Aug. 2020).

B. Menchtchilkov et al., "Reduction in overlay error from mark asymmetry using simulation, ORION, and alignment models", Proc. of SPIE, vol. 10587, pp. 105870C-105870C10 (2018).

* cited by examiner

METROLOGY METHOD AND ASSOCIATED METROLOGY AND LITHOGRAPHIC APPARATUSES

CROSS-REFERENCE TO RELATED APPLICATIONS

This application claims priority of EP application 20210371.9 which was filed on 27 Nov. 2020, and which is incorporated herein in its entirety by reference.

FIELD OF THE INVENTION

The present invention relates to methods and apparatus usable, for example, in the manufacture of devices by lithographic techniques, and to methods of manufacturing devices using lithographic techniques. The invention relates more particularly to metrology sensors and lithography apparatuses having such a metrology sensor.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

In other applications, metrology sensors are used for measuring exposed structures on a substrate (either in resist and/or after etch). A fast and non-invasive form of specialized inspection tool is a scatterometer in which a beam of radiation is directed onto a target on the surface of the substrate and properties of the scattered or reflected beam are measured. Examples of known scatterometers include angle-resolved scatterometers of the type described in US2006033921A1 and US2010201963A1. In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

Conventional alignment marks and metrology targets may comprise gratings which diffract incident radiation. In an alignment context, when the alignment marks are ideally perfectly symmetric, assuming no mark deformation, the Alignment Position Deviation error (APD error) is zero, resulting in the best overlay. Similarly an ideal overlay target would have asymmetry attributable to overlay only. However, as a result of processing, such as etching, chemical-mechanical polishing (CMP), annealing, deposition, oxidation, etc., real alignment marks and overlay targets are deformed in various ways, often resulting in asymmetries, which are not known beforehand. Typical asymmetries observed include Floor Tilt (FT), Top Tilt (TT) and Side Wall Angle (SWA). Furthermore, due to fluctuation in the processing, the depth of alignment marks/overlay targets can also vary around the nominal value.

The result of this may be a wavelength/polarization dependent variation in a measured value from the target or mark. As such, correction and/or mitigation for this variation is sometimes effected by performing a measurement using an optimized measurement condition or illumination condition (e.g., optimized different wavelengths and/or polarizations) for the target/stack being measured. It would be desirable to improve on the monitoring of the performance of the optimized measurement condition.

SUMMARY OF THE INVENTION

The invention in a first aspect provides a method to determine at least one performance indicator for a metrology process, the performance indicator being indicative of measurement performance for a measurement performed using a first measurement recipe, the method comprising: obtaining first measurement data relating to one or more setup substrates and a first set of measurement conditions; determining said first measurement recipe based on said first measurement data; and determining said at least one performance indicator from: one or more components of said first measurement data obtained from a component analysis or statistical decomposition; or a comparison of one or more first measurement values relating to said first measurement recipe and one or more second measurement values relating to a second measurement recipe, wherein the second measurement recipe is determined based on second measurement data, said second measurement data being different to said first measurement data and relating to a second set of measurement conditions, said second set of measurement conditions being different to said first set of measurement conditions.

Also disclosed is a metrology apparatus and a lithographic apparatus comprising a metrology device being operable to perform the method of the first aspect.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Before describing embodiments of the invention in detail, it is instructive to present an example environment in which embodiments of the present invention may be implemented.

Figure 1:
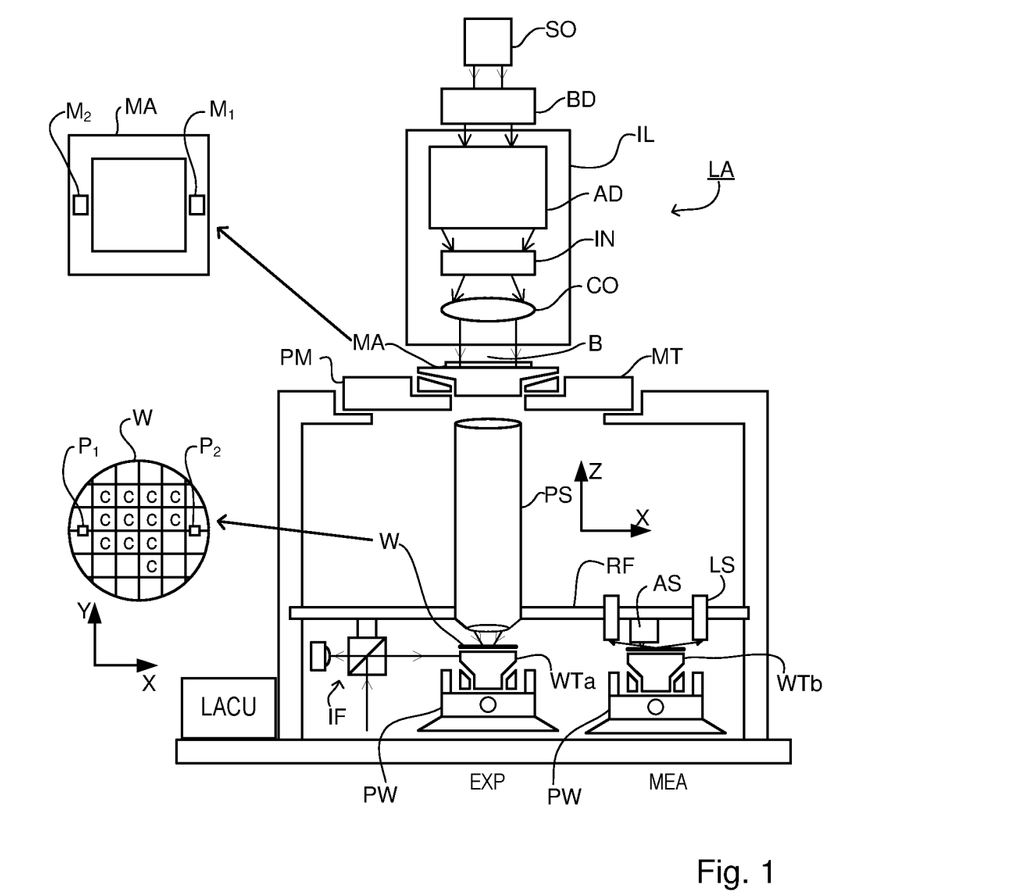
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
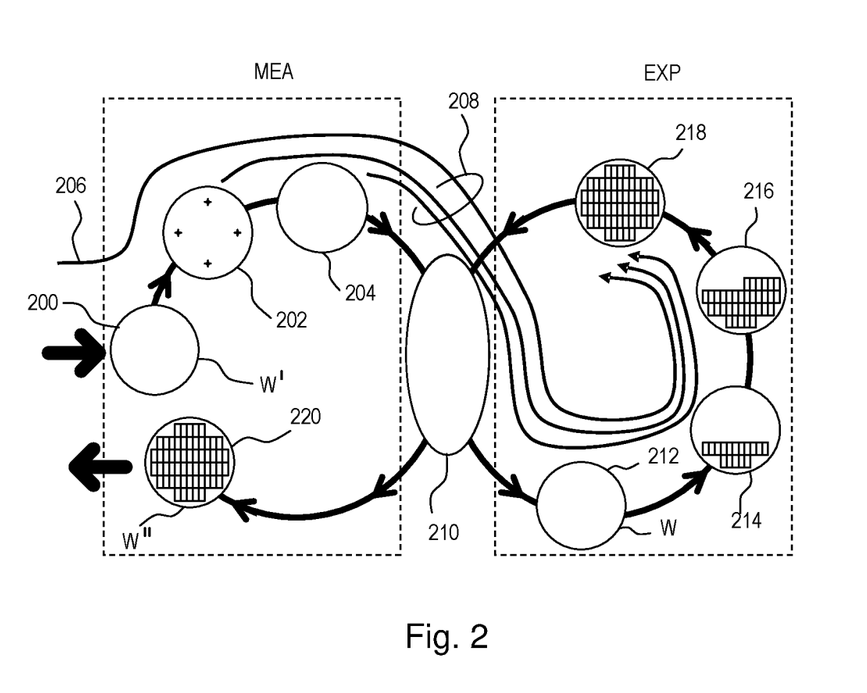
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 3:
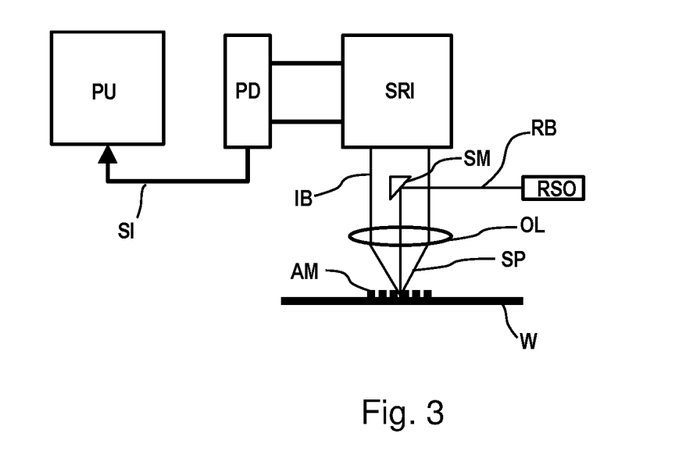
FIG. 3 is a schematic illustration of an alignment sensor adaptable according to an embodiment of the invention.

FIG. 3 is a schematic block diagram of an embodiment of a known alignment sensor AS. Radiation source RSO provides a beam RB of radiation of one or more wavelengths, which is diverted by diverting optics onto a target, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels are repeated at different wavelengths for increased accuracy and/or for robust detection of the mark irrespective of the materials from which the mark is made, and materials on and/or below which the mark is provided. Improvements in performing and processing such multiple wavelength measurements are disclosed below.

In lithographic processes, it is desirable to frequently make measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating may be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure in one image multiple targets from multiple gratings using light from hard X-ray, soft X-ray, extreme ultraviolet and visible to near-IR wave range.

Figure 4:
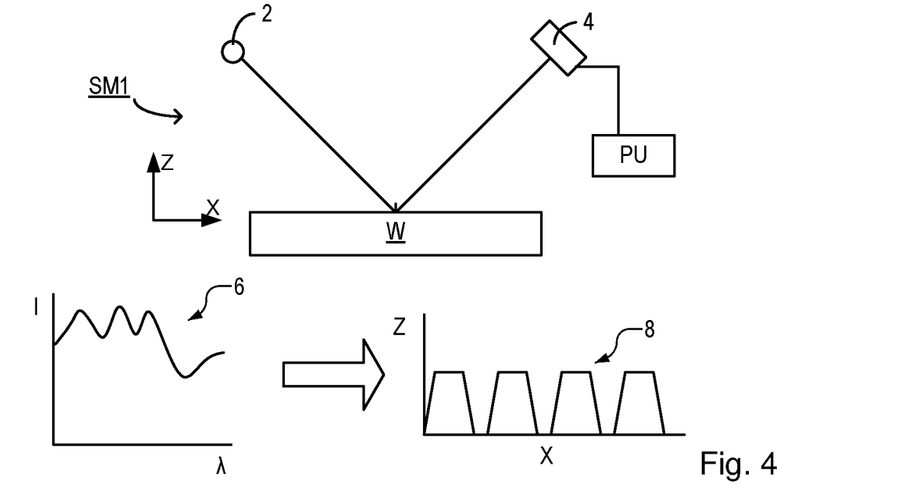
FIG. 4 schematically illustrates a scatterometry apparatus.

One example of a metrology apparatus, such as a scatterometer, is depicted in FIG. 4. It may comprise a broadband (e.g. white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength λ) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Scatterometers may comprise dark-field scatterometers (where the zeroth order is blocked before the detector such that only diffracted higher orders are captured) and bright-field scatterometers which also capture the zeroth order. Some scatterometers are capable of both bright-field and dark-field metrology. A known type of dark-field scatterometry technique compares the intensity of each of a pair of complementary higher diffraction orders (e.g., compares the respective intensities of the +1 and −1 orders) to determine asymmetry in the measured target (the magnitude of the intensity difference scales with the asymmetry. The target asymmetry can in turn be used to determine various parameters of interest such as overlay or the focus setting when the target was formed.

Throughout the description, as is conventional, the term mark or alignment mark may be used to describe a target used for alignment and the term target used to describe a metrology target used for process monitoring (e.g., an overlay or focus target). The term target can be used to generally describe either type of structure, and encompasses both targets specifically formed for metrology purposes and any other structure used for metrology, including actual product structure if said product structure is directly measured.

The concepts disclosed herein are equally applicable to alignment or other metrology techniques such as (e.g., scatterometry based) overlay and/or focus monitoring.

When radiation emitted by a metrology sensor interacts with a target and diffracts, such diffracted radiation comprises information regarding the target geometry. Therefore, for asymmetric (deformed) targets (e.g., asymmetric alignment marks or overlay/focus targets comprising unwanted asymmetry contributions attributable to effects other than overlay/focus), the metrology tool will detect a measurement value (e.g., position or overlay/focus value) which differs from the real measurement value on the wafer. This measurement error may be referred to, in the context of alignment, as alignment position error which is a measure of the difference of a measured aligned position of a target and a true aligned position of a target. This position difference causes overlay errors, which are strongly dependent on the type and magnitude of the asymmetry induced in the target, and depend also on the target depth.

Contributors to aligned position error comprise, for example:
  Grating asymmetry—unwanted grating asymmetry, for example in the form of floor tilt in the bottom grating or unequal side wall angles, cause a wavelength dependent aligned position error.
  Thickness variation and sensor aberrations—Layer thickness variation and interference within a stack can redistribute light within the pupil, which in combination with sensor aberrations causes aligned position error.
  Residual topography and surface roughness—When the signal strength is low, topography and surface roughness can cause aligned position error, which due to interference, is wavelength dependent.

To mitigate this, some scatterometers and/or alignment sensors measure using multiple different wavelengths (e.g., in respective measurement channels or otherwise). In an ideal situation, all wavelengths used in a multi-wavelength measurement would produce the same measurement result for a target on a geometrically perfect substrate. However, due to the asymmetries and unwanted target contributions, this is typically not the case and a wavelength dependent or color-to-color position variation is observed.

In the context of alignment, methods which enable correction for or mitigation for aligned position error are known, based on multiple wavelength measurements. Some solutions typically attempt to determine the most accurate wavelength for a particular target/stack and use this. An improved solution, described in more detail in US publication US2019/0094721 A1 (which is incorporated herein by reference), comprises a technique referred to as optimal color weighting (OCW). It should be appreciated that aligned position error scales differently for different colors (e.g. wavelengths or polarizations) as well as depending on layer thickness variations and the type of target being measured. OCW based methods aim to determine an optimal (e.g., weighted) combination (e.g., a measurement recipe) of all the colors used to minimize the impact of target deformations on a measurement value.

It is desirable to derive a performance measure or performance indicator (e.g., a key performance indicator (KPI)) to monitor and assess the performance of the optimized measurement recipe being used. Many wafer alignment related performance indicators depend on measured post-exposure measurement data (e.g., overlay data or other reference) to achieve this. It would be useful to derive a performance indicator without the need for overlay data or other post-exposure measurement data (e.g., using only pre-exposure measurement data or alignment data).

A performance indicator presently used is known as the Residual Overlay Performance Indicator (ROPI). ROPI is an indicator used to measure residual wafer grid differences between the process layers and an absolute grid, as defined by the exposure tool stage. More specifically, ROPI may be defined as the 3σ of the wafer residuals (difference) of the measured position versus the modeled positions. While ROPI can be used to predict the overlay color to color behavior, it is not a very accurate measure, and also not always very useful.

There may be two distinct phases in metrology (alignment or post-exposure monitoring such as overlay or focus metrology):
  A recipe setup phase, in which a multi-wavelength measurement recipe (e.g. color weights) is determined. The recipe optimizes measurement accuracy in the presence of process variations which occur in the wafers that are measured during recipe setup. During recipe setup, external reference data may or may not be available.
  A manufacturing phase (e.g., high volume manufacturing (HVM)) phase, where multiple wafers are exposed at high speed (i.e., with high throughput). It is desirable to check the performance or "health" of the recipe immediately after the measurement and before proceeding to the next step (e.g. exposure in case of an alignment measurement or etching in case of an overlay measurement). In this manner, it can be assessed when the recipe should be updated (or other actions taken) so as to avoid wafers being exposed out-of-spec (i.e., with one or more defects). Because it is desirable that this health check is performed immediately (or very soon) after the measurement, no external reference data will be available (e.g., measurements from previously exposed wafers).

Two embodiments will be described for determining a KPI for monitoring the performance or health of an optimized measurement recipe or measurement setting, which does not require post-exposure metrology data and can be used to assess the recipe from the measurement data immediately after the measurements are made.

A first embodiment comprises comparing a measurement using a first measurement recipe which was optimized based on a first measurement dataset relating to a first set of measurement conditions to a second measurement using a second measurement recipe which was optimized based on a second measurement dataset relating to a second set of measurement conditions, where the second set of measurement conditions is different to said first set of measurement conditions.

In one embodiment, the second set of measurement conditions may comprise a proper subset of the first set of measurement conditions. The result of the comparison (e.g., the difference of the first and second measurements) may be used as a KPI to monitor performance of said first measurement recipe. In such an embodiment, the first set of measurement conditions may comprise (optionally) all available measurement conditions, or all available measurement conditions of a particular type or group (e.g., all available wavelengths or illumination conditions). The second set of measurement conditions will then be a proper subset of these (e.g., a proper subset of wavelengths or illumination conditions).

In other embodiments, the second set of measurement conditions may comprise a proper subset of the first set of measurement conditions plus additional measurement conditions. Alternatively, the second set of measurement conditions may comprise a completely distinct set of measurement conditions from the first set of measurement conditions.

In a setup or training phase the second measurement subset may be chosen such that the first measurement and second measurement are the same or sufficiently similar in value. Then, in the manufacturing phase, the difference (i.e., the KPI) between corresponding measurements relating respectively to the first measurement recipe and second measurement recipe can be monitored to see if it drifts to a larger value. If it drifts too much (e.g., beyond a threshold or one of multiple thresholds) one or more corrective actions may be taken.

The type of measurement conditions in which the second set of measurement conditions may vary from the first set of measurement conditions, may be construed broadly. The measurement conditions may vary in terms of, for example: illumination conditions (e.g., wavelengths, polarization states or wavelength/polarization combinations) intensity imbalance measurements (e.g., a difference in intensity between respective intensities of each of a pair of complementary diffraction orders from the target (e.g., +1, −1 orders) wafers measured, points on each wafer or lots used which are to optimize the first measurement recipe, or any combination of two or more of these. This is a non-exhaustive list and may include any measurement condition for which a variation thereof may result in a variation in a measured value for a parameter of interest.

The method of determining the first measurement recipe and second measurement recipe may comprise determining which one or more color/polarization combinations are to be used and/or determining a weighting for each of the color/polarization combinations; e.g., in the context of alignment, determining an OCW using the methods described above.

Figure 5:
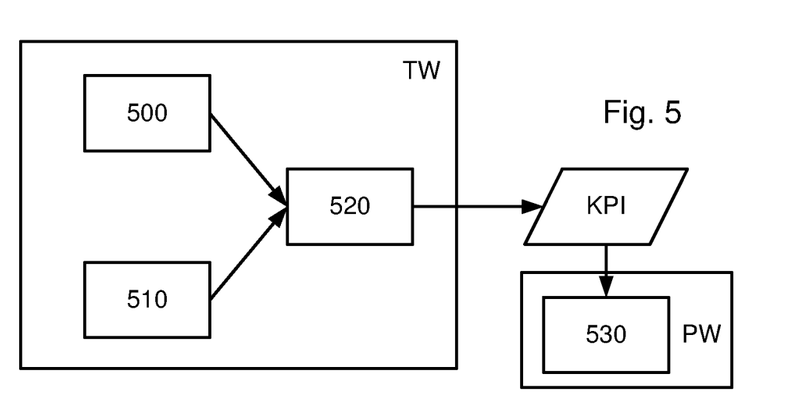
FIG. 5 is a flowchart of a method according to a first embodiment.

FIG. 5 is a flowchart describing such a method, for which, in this example, the second set of measurement conditions is a proper subset of the first set of measurement conditions. Steps 500, 510 and 520 are performed as a setup phase on one or more training wafers TW. At step 500, a first measurement recipe is determined based on first measurement data relating to a first set of measurement conditions. The first set of measurement conditions may comprise all available measurement conditions. This step may comprise an optimization of the measurement conditions to determine an optimized measurement recipe for a particular application (e.g., particular stack/target etc.). For example, the optimized measurement recipe may provide the most accurate measurement value possible given the available measurement conditions. However it cannot be used by itself to assess the performance of the recipe so as to check it remains healthy. In a specific example, this step may comprise determining a first weighting (e.g., to optimize OCW weights) for the color/polarization combinations based on all the available information from the training wafers TW.

At step 510, a determination or optimization is performed to determine said second measurement recipe (different from the first measurement recipe). Step 500 is essentially a repeat of step 510, but using a different dataset (second measurement data) comprising a proper subset of the first measurement data, insofar as the second measurement data relates to a proper subset of the first set of measurement conditions (i.e., a second set of measurement conditions). In a specific example, this step may comprise determining a second weighting (e.g., to optimize OCW weights) for the color/polarization combinations based on a proper subset of the available information from the training wafers TW. The proper subset of information may be a subset of one or more of the available illumination conditions, wafers, measurement points per wafer, lots. This subset may not necessarily give the best measurement value, but should be sensitive to changes in asymmetric target deformation. As mentioned above, the second measurement data does not need to relate to a proper subset of the first set of measurement conditions (e.g., where the first set of measurement conditions is a subset of all available measurement conditions).

At step 520, the KPI is determined from the difference or other comparison of one or more measurements performed using said first measurement recipe and second measurement recipe respectively. For example, the KPI may comprise a (e.g., minimized) alignment position difference or overlay difference between the measurement values.

Step 530 may be performed, for example, in a HVM setting on production wafers PW. As measurements are performed (whether alignment or post exposure metrology) to obtain production metrology data, a comparison is made between first measurement values (first production measurement data) and second measurement values (second production measurement data) from the same target(s) using respectively the first measurement recipe and second measurement recipe. Where the first measurement recipe and second measurement recipe differ in terms of illumination conditions, for example, it may be that the measurement data relates to measurements performed with all available illumination conditions (e.g., measured simultaneously), and the first and second measurement values are determined by processing of this measurement data. Based on the comparison, either metrology continues as before (e.g., where the KPI has not drifted too much) or one or more corrective actions may be performed. Examples of corrective actions will be described below.

When the KPI has drifted significantly, this means that the first measurement recipe and second measurement recipe is no longer measuring the same measurement value, which is indicative of a new asymmetry mode or contribution in the target.

A second embodiment will now be described, in which the KPI is based on a statistical decomposition method or component analysis method which transforms the measurement data into a statistical domain. The method will be described in terms of principal component analysis (PCA), however it can be appreciated than any similar statistical method may be used, such as for example single value decomposition (SVD) or independent component analysis (ICA).

It is proposed to apply such a component analysis (e.g., PCA) to the (e.g., target-level) setup measurement data obtained during the recipe setup phase to determine (e.g., principal) components of that data. The KPI, in such an embodiment, may be based on a comparison of (e.g., HVM) the setup measurement data and the determined one or more principal components (or other components) of the measurement data. For example, the KPI may be a quantification of the similarity (or difference, which of course is essentially the same thing—a similarity metric by definition also quantifies the difference), e.g., according to any suitable similarity metric, between the HVM measurement data and the principal component(s). During a manufacturing phase (e.g., HVM), the measurement recipe may be monitored by comparing the HVM measurement data to the principal components determined during the recipe setup phase. As before, any drift in the KPI may trigger corrective action.

Measurement data may comprise, for example one or more of variation of a performance parameter or measurement parameter as function of wavelength and/or polarization (e.g., as measured in different measurement channels of a metrology tool). Such variation metrics as a function of illumination condition is often referred to as a swing curve. More specifically the measurement data may comprise one or more of (in any combination):

an APD swing curve;
a signal strength swing curve;
an intensity imbalance (Q) swing curve;
an intensity asymmetry metric swing curve such as an A+/A− curve (e.g., for intensity asymmetry based overlay techniques where A+ is the intensity asymmetry or intensity difference of complementary diffraction orders from a first biased or positively biased target and A− is the intensity asymmetry or intensity difference of complementary diffraction orders from a second biased or negatively biased target);
an overlay swing curve (e.g., for image based overlay metrology techniques, such as box-in-box overlay metrology).

The principal components basically describes the setup measurement data measured during recipe setup phase, in terms of fewer parameters than there are observables in the measured data. For example, if there are two dominant process variations, then there may be only two strong principal components, even if there are multiple measurement settings or multiple measurement channels, e.g., colors+polarizations+intensity channels. For example, there may be between 4 and 100 channels/measurement conditions or between 4 and 50 channels/measurement conditions (e.g., 4, 12, 24 or 48 channels). Each principal component swing curve may be described as a vector, e.g., with length corresponding to the number of measurement channels (e.g., 4/12/24/48). Of course you can always ignore one or more colors/channels for any reason, e.g., which do not provide reliable data.

In this way, the principal components (e.g., each comprising a respective swing curve) of the measurement data may each correspond with a respective asymmetry mode or process variation. By way of specific example, the recipe setup phase may be performed on metrology data relating to targets/wafers which are subject to two (dominant) process variations (e.g., a grating side wall angle variation and a layer thickness variation). In this case, the PCA will determine the two APD swing curves (i.e., the two principal components) which correspond to these two process variations. If, during manufacturing, a third process variation (e.g., a top tilt) appears, then the APD swing curve determined for the HVM measurement data will be different from the two principal components (and combinations thereof) determined in the setup phase. This difference (e.g., with respect to a similarity metric) can be used to flag an action, as the optimized measurement recipe may no longer be optimal.

Therefore, the KPI quantifies how closely the HVM measurement data is described by the principal components. When this is done at mark level, this typically will not require any principal component analysis (as in determining principal components) on the HVM measurement data. The KPI can describe the similarity between the (best combination of the) principal components and the HVM measurement. This KPI may be normalized. The KPI can be compared to a threshold and flag if the threshold is exceeded.

Figure 6:
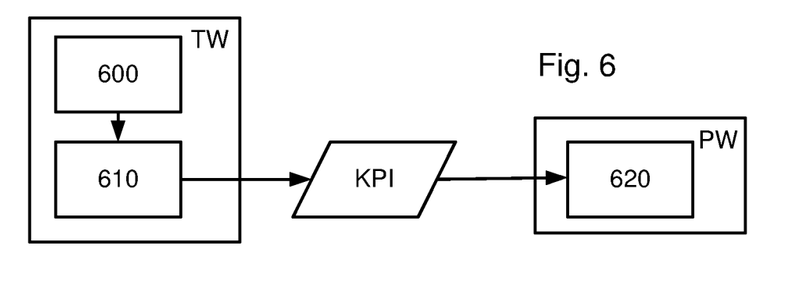
FIG. 6 is a flowchart of a method according to a second embodiment.

FIG. 6 is a flowchart describing such a method. In a recipe setup phase on training wafers TW, step 600 comprises determining an optimized measurement recipe (e.g., using all available measurement conditions). This step may be the same as step 500 of the previous embodiment. At step 610, a component analysis or statistical decomposition (e.g., PCA) is performed on the measurement data used to determine the optimized measurement recipe to determine the principal or independent components of the measurement data on which a KPI may be based. These principal or independent components may comprise respective swing curves. At step 620, in a production phase on production metrology data from production wafers PW, the production metrology data (e.g., also in the form of swing curves or a vector representation thereof) are compared to the determined principal/independent components, with the KPI describing their similarity/difference.

In either embodiment, if the KPI has not drifted significantly, or at least too far, it may be concluded that the process variation (e.g., grating asymmetry, layer thickness, etc.) is similar to that observed during recipe setup. If the KPI has drifted, it is indicative of a change in the process variation which may require correction action.

The corrective action may comprise performing a new recipe setup to obtain a new measurement recipe. This, however, incurs a large overhead in terms of time and therefore a more hierarchal approach may be taken depending on the degree that the KPI has drifted (e.g., there may be multiple thresholds for the KPI to trigger different actions). In a specific embodiment, the actions may be ranked according to the overhead; e.g.:

1. measurements can be invalidated or given a lower weight during processing; e.g., alignment measurements may be invalidated or given a lower weight when computing the wafer grid. The weight of the point in the grid is then a function of this KPI (e.g. inversely proportional);
2. (in an alignment context) a new multi-target alignment reference measurement can be triggered, optimizing weights based on alignment only. In other contexts this may comprise determining a new recipe optimization based only on the production measurement data;
3. When the KPI triggers, the OCW recipe (which is relevant for the exposure) and(/or) the principal components (which is relevant for understanding whether measured signals still match expectations/are OK) could be updated 'in a shadow-mode'. This may comprise exposing the wafers and then measuring overlay on the exposed wafers. The measured overlay could be used to update the OCW recipe (this does not hamper scanner throughput, which is highly desirable; there will be some delay in receiving the recipe update, but assuming the KPI (i.e., the process) has not drifted too far in that time, then this may be acceptable). At the same time that the OCW weights are updated based on the overlay data, the principal components can also be updated based on the alignment data (which triggered the KPI).
4. a completely new OCW training can be triggered (optimizing weights for the new set); this requires waiting for overlay measurements on these particular wafers to become available.

It should be appreciated that the term color is used throughout this text synonymously with wavelength and the colors may include those outside the visible band (e.g., infrared or ultraviolet wavelengths).

While specific embodiments of the invention have been described above, it will be appreciated that the invention may be practiced otherwise than as described.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the claims and their equivalents.

Embodiments of the present disclosure can be further described by the following clauses.

1. A method to determine at least one performance indicator for a metrology process, the performance indicator being indicative of measurement performance for a measurement performed using a first measurement recipe, the method comprising:
obtaining first measurement data relating to one or more setup substrates and a first set of measurement conditions;

determining said first measurement recipe based on said first measurement data; and determining said at least one performance indicator from:

one or more components of said first measurement data obtained from a component analysis or statistical decomposition; or a comparison of one or more first measurement values relating to said first measurement recipe and one or more second measurement values relating to a second measurement recipe, wherein the second measurement recipe is determined based on second measurement data, said second measurement data being different to said first measurement data and relating to a second set of measurement conditions, said second set of measurement conditions being different to said first set of measurement conditions.

2. A method of clause 1, wherein said determining a first measurement recipe comprises optimizing said first measurement recipe as a subset of said first set of measurement conditions so as to optimize accuracy of measurements performed using said first measurement recipe.

3. A method of clause 2, wherein said optimizing said first measurement recipe comprises determining one or more illumination conditions to be used for a measurement and/or determining a weighting for each of the illumination conditions to be used for a measurement.

4. A method of any preceding clause, wherein said performance indicator is determined from said comparison of said one or more first measurement values and said one or more second measurement values.

5. A method of clause 4, wherein said performance indicator is determined from a difference of said one or more first measurement values and said one or more second measurement values 6. A method of clause 4 or 5, wherein said second set of measurement conditions is different from said first set of measurement conditions in terms of one or more of:

illumination conditions used to obtain the respective measurement data, intensity imbalance measurements relating to the respective measurement data said one or more setup substrates, measurement points on each of said one or more setup substrates, lots or groups of said one or more setup substrates, or any combination of two or more of these.

7. A method of any of clauses 4 to 6, comprising optimizing said second measurement recipe as a subset of said second set of measurement conditions so as to optimize accuracy of measurements performed using said second measurement recipe, and such that said one or more first measurement values are similar to said one or more second measurement values.

8. A method of any of clauses 4 to 7 wherein said second measurement data comprises a proper subset of said first measurement data and said second set of measurement conditions comprises a proper subset of said first set of measurement conditions.

9. A method of clause 8, wherein said second set of measurement conditions comprises a proper subset of illumination conditions comprised within said first set of measurement conditions, and said optimizing said second measurement recipe comprises determining one or more illumination conditions to be used for a measurement and/or determining a weighting for each of the illumination conditions to be used for a measurement.

10. A method of any of clauses 4 to 9, comprising:

obtaining first production measurement data relating to metrology performed on a production substrate using said first measurement recipe;

obtaining second production measurement data relating to metrology performed on a production substrate using said second measurement recipe; and comparing the first processed production measurement data and the second processed production measurement data.

11. A method of any of clauses 1 to 3, wherein said at least one performance indicator is determined from one or more components of said first measurement data obtained from:

a principal component analysis;

an independent component analysis; or a single value decomposition.

12. A method of clause 11, wherein said measurement data comprises one or more swing curves, wherein the each swing curve describes the variation of a measurement parameter as function of illumination condition.

13. A method of clause 12, wherein the measurement data comprises one or more of, in any combination:

a measurement offset swing curve;

a signal strength swing curve;

an intensity imbalance swing curve;

an intensity asymmetry metric swing curve;

an overlay swing curve.

14. A method of any of clauses 11 to 13, comprising:

obtaining production measurement data relating to said first measurement recipe; and determining said at least one performance indicator as a comparison of said production measurement data to said one or more components of said first measurement data.

15. A method of clause 10 or 14, comprising comparing the result of the comparison step to at least one threshold value and performing at least one corrective action if the at least one threshold value is exceeded.

16. A method of clause 15, wherein said at least one corrective action comprises performing a recipe setup to determine a new first measurement recipe.

17. A method of clause 15 or 16, wherein said at least one corrective action comprises invalidating and/or applying a weighting to said production measurement data.

18. A method of clause 15, 16 or 17, wherein said at least one threshold value comprises a plurality of threshold values, each relating to a corresponding different corrective action.

19. A method of clause 10 or any of clauses 14 to 18, comprising performing a metrology action to obtain said production metrology data.

20. A method of clause 10 or any of clauses 14 to 19, wherein said production measurement data comprises alignment data and said first measurement recipe comprises a measurement recipe for alignment metrology.

21. A method of clause 10 or any of clauses 14 to 20, wherein said production measurement data comprises post-exposure metrology data and said first measurement recipe comprises a measurement recipe for post-exposure metrology.

22. A method of clause 21, wherein said post-exposure metrology data comprises overlay or focus data and said first measurement recipe comprises a measurement recipe for overlay or focus metrology.

23. A computer program comprising program instructions operable to perform the method of any of any preceding clause, when run on a suitable apparatus.

24. A non-transient computer program carrier comprising the computer program of clause 23.

25. A processing arrangement comprising:
   the non-transient computer program carrier of clause 24; and
   a processor operable to run the computer program comprised on said non-transient computer program carrier.

26. A metrology apparatus comprising the processing arrangement of clause 25.

27. A metrology apparatus of clause 26 comprising a scatterometer and being operable to measure post-exposure metrology data.

28. An alignment sensor comprising the processing arrangement of clause 25.

29. A lithographic apparatus comprising:
   the alignment sensor of clause 28;
   a patterning device support for supporting a patterning device; and
   a substrate support for supporting a substrate.

The invention claimed is:

1. A method to determine at least one performance indicator for a metrology process, the performance indicator being indicative of measurement performance for a measurement performed using a first measurement recipe, the method comprising:
   obtaining first measurement data relating to one or more setup substrates and a first set of measurement conditions;
   determining the first measurement recipe based on the first measurement data; and
   determining the at least one performance indicator from:
      one or more components of the first measurement data obtained from a component analysis or statistical decomposition; or
      a comparison of one or more first measurement values relating to the first measurement recipe and one or more second measurement values relating to a second measurement recipe, wherein the second measurement recipe is determined based on second measurement data, the second measurement data being different to the first measurement data and relating to a second set of measurement conditions, the second set of measurement conditions being different to the first set of measurement conditions.

2. The method as claimed in claim 1, wherein the determining the first measurement recipe comprises optimizing the first measurement recipe as a subset of the first set of measurement conditions so as to optimize accuracy of measurements performed using the first measurement recipe.

3. The method as claimed in claim 2, wherein the optimizing the first measurement recipe comprises determining one or more illumination conditions to be used for a measurement and/or determining a weighting for each illumination condition to be used for a measurement.

4. The method as claimed in claim 1, wherein the performance indicator is determined from the comparison of the one or more first measurement values and the one or more second measurement values.

5. The method as claimed in claim 4, wherein the performance indicator is determined from a difference of the one or more first measurement values and the one or more second measurement values.

6. The method as claimed in claim 4, wherein the second set of measurement conditions is different from the first set of measurement conditions in terms of one or more selected from:
   illumination conditions used to obtain the respective measurement data,
   intensity imbalance measurements relating to the respective measurement data,
   the one or more setup substrates,
   measurement points on each of the one or more setup substrates,
   lots or groups of the one or more setup substrates, or
   any combination of two or more of these.

7. The method as claimed in claim 4, comprising optimizing the second measurement recipe as a subset of the second set of measurement conditions so as to optimize accuracy of measurements performed using the second measurement recipe, and such that the one or more first measurement values are similar to the one or more second measurement values.

8. The method as claimed in claim 4, wherein the second measurement data comprises a proper subset of the first measurement data and the second set of measurement conditions comprises a proper subset of the first set of measurement conditions.

9. The method as claimed in claim 8, wherein the second set of measurement conditions comprises a proper subset of illumination conditions comprised within the first set of measurement conditions, and the optimizing the second measurement recipe comprises determining one or more illumination conditions to be used for a measurement and/or determining a weighting for each illumination condition to be used for a measurement.

10. The method as claimed in claim 4, comprising:
   obtaining first production measurement data relating to metrology performed on a production substrate using the first measurement recipe;
   obtaining second production measurement data relating to metrology performed on a production substrate using the second measurement recipe; and
   comparing the first processed production measurement data and the second processed production measurement data.

11. The method as claimed in claim 10, wherein the production measurement data comprises alignment data and the first measurement recipe comprises a measurement recipe for alignment metrology.

12. The method as claimed in claim 10, wherein the production measurement data comprises post-exposure metrology data and the first measurement recipe comprises a measurement recipe for post-exposure metrology.

13. The method as claimed in claim 1, wherein the at least one performance indicator is determined from one or more components of the first measurement data obtained from:
   a principal component analysis;
   an independent component analysis; or
   a single value decomposition.

14. The method as claimed in claim 13, wherein the measurement data comprises one or more swing curves, wherein each swing curve describes variation of a measurement parameter as a function of illumination condition.

15. A non-transient computer program carrier comprising instructions therein, the instructions, when executed by a computer system, configured to cause the computer system to perform claim 1.

16. A processing arrangement comprising:
   the non-transient computer program carrier of claim 15; and
   a processor operable to run the instructions of the non-transient computer program carrier.

17. A metrology apparatus comprising the processing arrangement of claim 16.

18. The metrology apparatus as claimed in claim 17, comprising a scatterometer and being operable to measure post-exposure metrology data.

19. An alignment sensor comprising the processing arrangement of claim 16.

20. A lithographic apparatus comprising:
   the alignment sensor of claim 19;
   a patterning device support for supporting a patterning device; and
   a substrate support for supporting a substrate.

* * * * *